(12) United States Patent
Acar et al.

(10) Patent No.: US 8,969,104 B2
(45) Date of Patent: Mar. 3, 2015

(54) CIRCUIT TECHNIQUE TO ELECTRICALLY CHARACTERIZE BLOCK MASK SHIFTS

(75) Inventors: Emrah Acar, Montvale, NJ (US); Aditya Bansal, White Plains, NY (US); Dureseti Chidambarrao, Weston, CT (US); Liang-Teck Pang, White Plains, NY (US); Amith Singhee, Yonkers, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/488,532

(22) Filed: Jun. 5, 2012

(65) Prior Publication Data

US 2013/0320340 A1     Dec. 5, 2013

(51) Int. Cl.
   *H01L 23/34*     (2006.01)
(52) U.S. Cl.
   USPC ..................................... 438/17; 257/E21.531
(58) Field of Classification Search
   CPC . H01L 27/1104; H01L 27/11; H01L 27/0207; H01L 21/84; H01L 21/26513
   IPC ............................................ H01L 23/50, 27/11
   See application file for complete search history.

(56) References Cited

U.S. PATENT DOCUMENTS

| | | | |
|---|---|---|---|
| 6,281,696 B1 | 8/2001 | Voogel | |
| 6,475,871 B1 | 11/2002 | Stine et al. | |
| 6,507,942 B1 | 1/2003 | Calderone et al. | |
| 7,369,697 B2 | 5/2008 | Starikov | |
| 7,736,916 B2 | 6/2010 | Aghababazadeh et al. | |
| 7,807,480 B2 | 10/2010 | Stine et al. | |
| 2007/0238204 A1 | 10/2007 | Kurihara et al. | |
| 2010/0140617 A1 | 6/2010 | Kuroda | |
| 2011/0115463 A1* | 5/2011 | Acar et al. ................... | 324/71.1 |

FOREIGN PATENT DOCUMENTS

JP          04053092 A     2/1992

OTHER PUBLICATIONS

Yee, PL et al., IBM TDB, Feb. 1, 1987, "Structure for Electrical Measurement of Overlay Betweem P+ Layer and Isolation", IP.Com No. IPCOM000038718D, Published Jan. 31, 2005.
Hecht, LC et al., IBM TDB, Oct. 1, 1981, "Electrical Measurements of Mask Runout and Mask to . . . Product Wafers", IP.Com No. IPCOM000053693D, Published Feb. 12, 2005.

\* cited by examiner

*Primary Examiner* — Tony Tran
(74) *Attorney, Agent, or Firm* — Preston J. Young; Otterstedt, Ellenbogen & Kammer, LLP

(57) ABSTRACT

A physical test integrated circuit has a plurality of repeating circuit portions corresponding to an integrated circuit design. A first of the portions is fabricated with a nominal block mask location, and additional ones of the portions are deliberately fabricated with predetermined progressive increased offset of the block mask location from the nominal block mask location. For each of the portions, the difference in threshold voltage between a first field effect transistor and a second field effect transistor is determined. The predetermined progressive increased offset of the block mask location is in a direction from the first field effect transistor to the second field effect transistor. The block mask overlay tolerance is determined at a value of the progressive increased offset corresponding to an inflection of the difference in threshold voltage from a zero difference. A method for on-chip monitoring, and corresponding circuits, are also disclosed.

2 Claims, 14 Drawing Sheets

CIRCUIT TECHNIQUE TO ELECTRICALLY CHARACTERIZE BLOCK MASK SHIFTS

STATEMENT OF GOVERNMENT RIGHTS

Not Applicable.

CROSS-REFERENCE TO RELATED APPLICATIONS

Not Applicable.

FIELD OF THE INVENTION

The present invention relates to the electrical and electronic arts, and, more particularly, to circuit testing and fabrication techniques and the like.

BACKGROUND OF THE INVENTION

In the field of integrated circuit (IC) fabrication, technology scaling continues; i.e., the size of circuit features continues to decrease. With technology scaling, process imperfections result in deviation of actual on-wafer patterns from the designed circuit layout. To fabricate a layout, each wafer has to go through patterning of several layers to fabricate transistors, contacts and interconnects. A tool has to physically pick a mask and align it with the wafer to fabricate the desired pattern. With minimum feature size on a wafer scaled to less than 30 nm, the alignment tolerance is typically reduced to less than 5 nm for several significant layers. Static Random Access Memories (SRAMs) are an example of a type of circuit that is particularly vulnerable to this kind of impact. This is due to the extremely dense layouts and very stringent ground rules associated with SRAMs.

SUMMARY OF THE INVENTION

Principles of the invention provide circuit techniques for electrically characterizing block mask shifts. In one aspect, an exemplary method of characterizing block mask overlay tolerance of an integrated circuit design includes the step of obtaining a physical test integrated circuit having a plurality of repeating circuit portions corresponding to the integrated circuit design. A first of the portions is fabricated with a nominal block mask location, and additional ones of the portions are deliberately fabricated with predetermined progressive increased offset of the block mask location from the nominal block mask location. A further step includes, for each of the portions, determining a difference in threshold voltage between a first field effect transistor and a second field effect transistor, wherein the predetermined progressive increased offset of the block mask location is in a direction from the first field effect transistor to the second field effect transistor. A still further step includes determining the block mask overlay tolerance at a value of the progressive increased offset corresponding to an inflection of the difference in threshold voltage from a zero difference.

In another aspect, another exemplary method includes the step of obtaining an actual integrated circuit conforming to a proposed integrated circuit design. The actual integrated circuit has formed thereon on-chip monitoring circuitry configured to determine threshold voltage difference between at least two actual transistors on the actual integrated circuit. Further steps include measuring the threshold voltage difference between the at least two actual transistors on the actual integrated circuit; and determining actual block mask overlay in the actual integrated circuit by correlating the measured threshold voltage difference to results of testing on the proposed integrated circuit design.

In a further aspect, an on-chip monitoring circuit for determining threshold voltage difference includes a supply voltage node, a selective ground, and a plurality of repeating circuit structures. Each of the repeating circuit structures in turn includes a left-hand p-type field effect transistor having a first drain-source terminal coupled to the supply voltage node, a gate, and a second drain source terminal coupled to the gate; a right-hand p-type field effect transistor having a first drain-source terminal coupled to the supply voltage node, a gate coupled to the gate of the left-hand p-type field effect transistor, and a second drain source terminal; a left-hand n-type field effect transistor having a first drain-source terminal coupled to the second drain source terminal of the left-hand p-type field effect transistor; a gate, and a second drain source terminal coupled to the selective ground; and a right-hand n-type field effect transistor having a first drain-source terminal coupled to the second drain source terminal of the right-hand p-type field effect transistor; a gate, and a second drain source terminal coupled to the selective ground.

In still a further aspect, design structures directed to circuits of the kind described and/or portions thereof are provided.

As used herein, "facilitating" an action includes performing the action, making the action easier, helping to carry the action out, or causing the action to be performed. Thus, by way of example and not limitation, instructions executing on a processor might facilitate an action carried out by an integrated circuit fabrication tool or test setup (e.g., voltage supply), by sending appropriate data or commands to cause or aid the action to be performed. For the avoidance of doubt, where an actor facilitates an action by other than performing the action, the action is nevertheless performed by some entity or combination of entities.

One or more embodiments of the present invention may be realized in the form of an integrated circuit.

One or more embodiments of the invention or elements thereof (for example, control software for controlling fabrication tools or test setups, such as voltage supplies) can be implemented in the form of a computer program product including a computer readable storage medium with computer usable program code for performing the method steps indicated. Furthermore, one or more embodiments of the invention or elements thereof can be implemented in the form of a system (for example, a control system for controlling fabrication tools or test setups, such as voltage supplies) including a memory, and at least one processor that is coupled to the memory and operative to perform exemplary method steps. Yet further, in another aspect, one or more embodiments of the invention or elements thereof can be implemented in the form of means for carrying out one or more of the method steps described herein; the means for carrying out fabrication steps can include various integrated circuit fabrication equipment, while control system means could include (i) hardware module(s), (ii) software module(s) stored in a computer readable storage medium (or multiple such media) and implemented on a hardware processor, or (iii) a combination of (i) and (ii); any of (i)-(iii) implement the specific techniques set forth herein.

These and other features and advantages of the present invention will become apparent from the following detailed description of illustrative embodiments thereof, which is to be read in connection with the accompanying drawings.

DETAILED DESCRIPTION OF PREFERRED EMBODIMENTS

As noted, in the field of integrated circuit (IC) fabrication, technology scaling continues; i.e., the size of circuit features continues to decrease. With technology scaling, process imperfections result in deviation of actual on-wafer patterns from the designed circuit layout. To fabricate a layout, each wafer has to go through patterning of several layers to fabricate transistors, contacts and interconnects. A tool has to physically pick a mask and align it with the wafer to fabricate the desired pattern. With minimum feature size on a wafer scaled to less than 30 nm, the alignment tolerance is typically reduced to less than 5 nm for several significant layers. Static Random Access Memories (SRAMs) are an example of a type of circuit that is particularly vulnerable to this kind of impact. This is due to the extremely dense layouts and very stringent ground rules associated with SRAMs.

Figure 1:
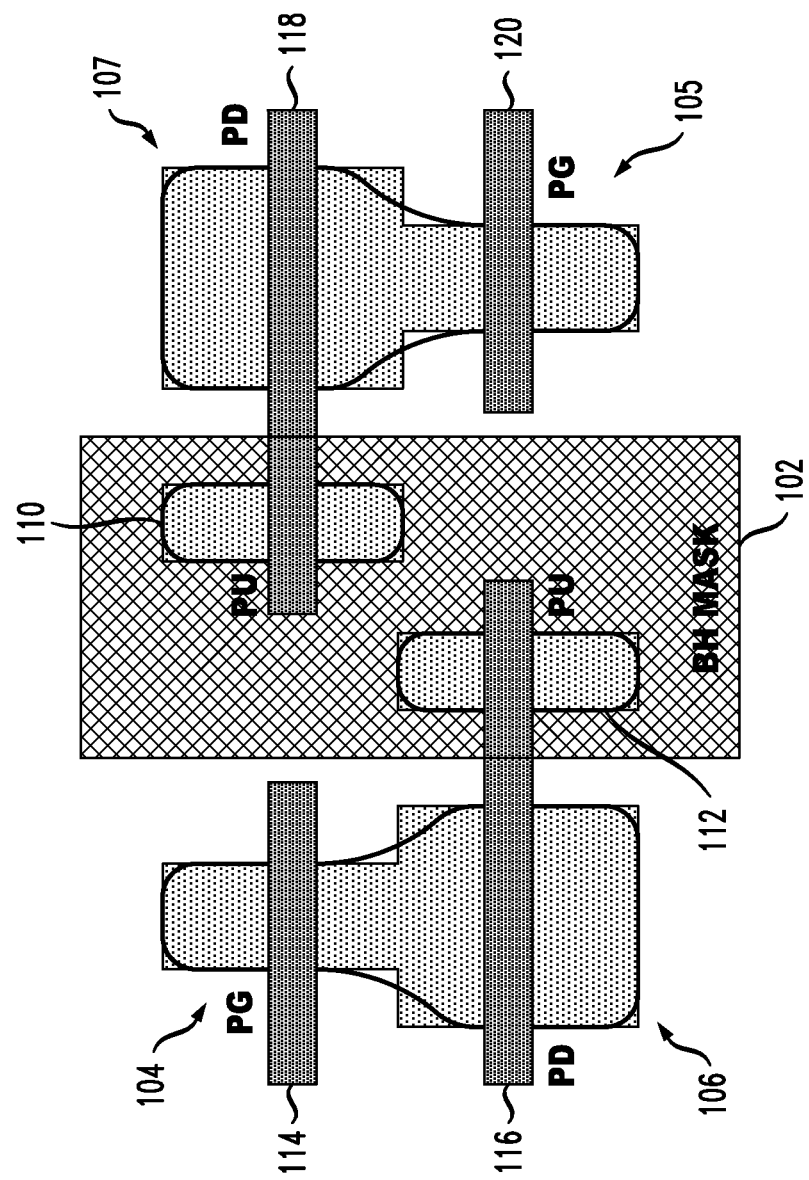
FIG. 1 shows the layout of an exemplary six-transistor SRAM cell, as known in the prior art.

For example, FIG. 1 shows an exemplary layout of a 6-transistor SRAM cell, as known in itself from the prior art. A blocking mask 102 referred to as "BH" is used to dope the NMOS transistors PG (pass gate, referred to by reference characters 104, 105) and PD (pull-down, referred to by reference characters 106, 107), while blocking the PMOS transistors PU (pull-up, referred to as 110, 112). Transistors are doped after the fabrication of silicon field effect transistor (FET) regions 104-107, 110, and 112 and gates 114, 116, 118, 120. If the BH mask 102 shifts a few nanometers to the right, some doping atoms may not reach the right-hand PD NMOS 107, thereby causing an undesirable threshold voltage value in the right-hand PD NMOS 107. On the other hand, the left-hand PD NMOS 116 will be fabricated as desired. Also, right-shifting of BH mask 102 may also cause some contamination in the left-hand PU PMOS 112 (which may get exposed to doping atoms meant for the NMOS transistors) thereby reducing the magnitude of its threshold-voltage. This can result in an asymmetric SRAM cell with mismatched left and right transistors, causing reduced yield. There are several block mask layers 102 used to expose some transistors while blocking others. Their cumulative variation can result in significantly lower yield.

One or more embodiments advantageously allow, for a given fabrication tool, the ability to analyze the electrical impact of block mask overlay during the technology ramp-up cycle. One or more embodiments allow answering one or more of the following questions to design a robust technology:

How much does the overlay vary across a wafer and within a die?

How much overlay can a circuit or technology tolerate (within the bounds of tolerable electrical variations)?

One or more embodiments enable the above analyses by providing accurate measurement and characterization of overlay.

Currently, several transistors are manufactured in a given technology, and then measured to determine the statistical variation in transistor parameters, such as mobility, threshold-voltage, and so on. However, these measurements show the cumulative effect of several sources of variation along with overlay. There is currently no effective way to isolate the impact of overlay. Isolation of overlay impact is desirable to determine certain ground rules which directly impact overlay; for example, minimum distance between the NMOS PD transistor 106 or 107 and corresponding PMOS PU transistor 112 or 110, respectively.

In one aspect, embodiments of the invention analyze the statistical variation and tolerance of block mask overlay in SRAM cells and/or arrays via novel and accurate electrical characterization circuits. One or more embodiments involve design of special SRAM cells based on the core SRAM cell layout, with deliberately shifted block doping masks, to isolate transistors of interest.

Figure 2:
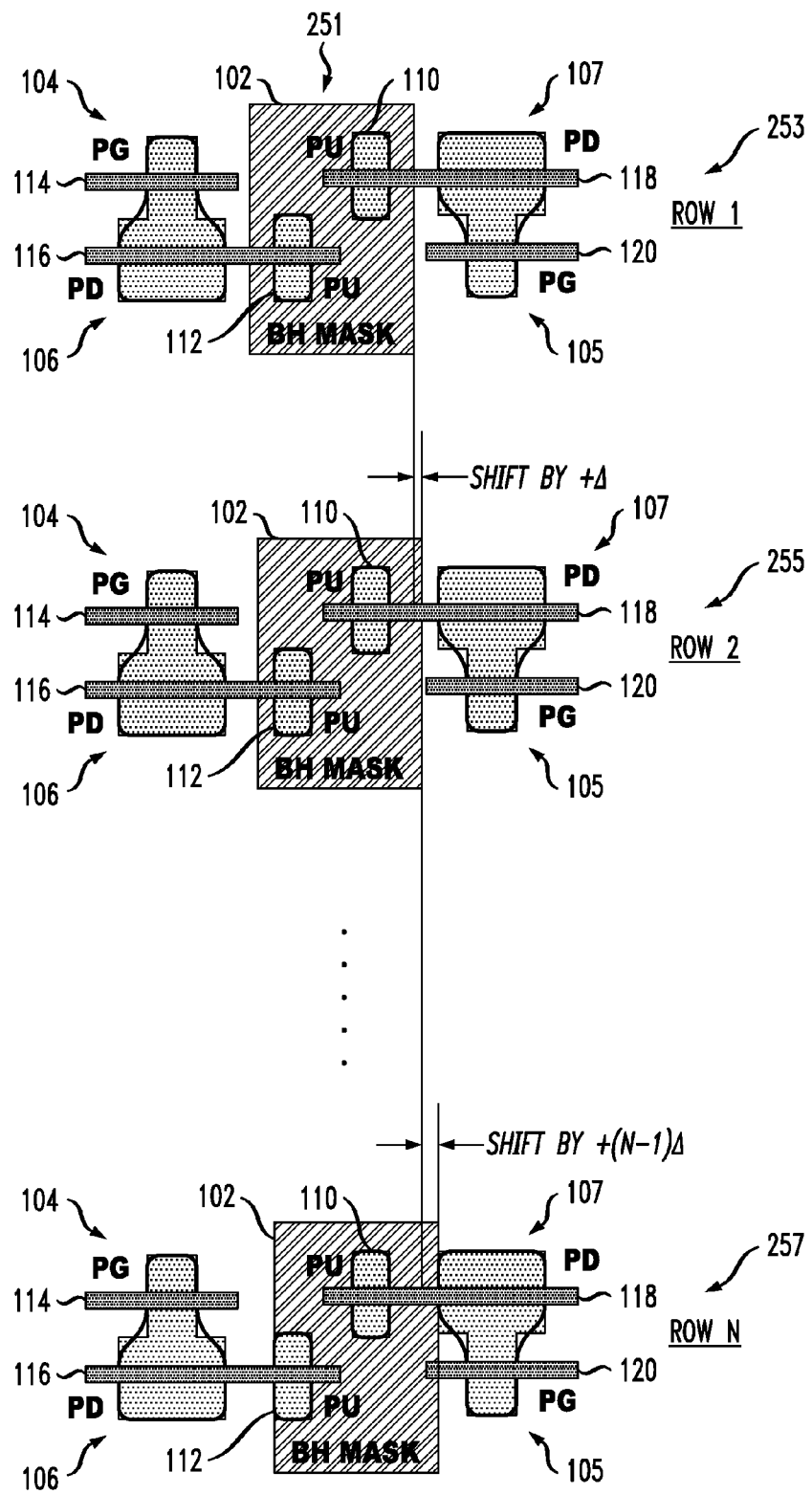
FIG. 2 shows a layout in accordance with an aspect of the invention.
Figure 3:
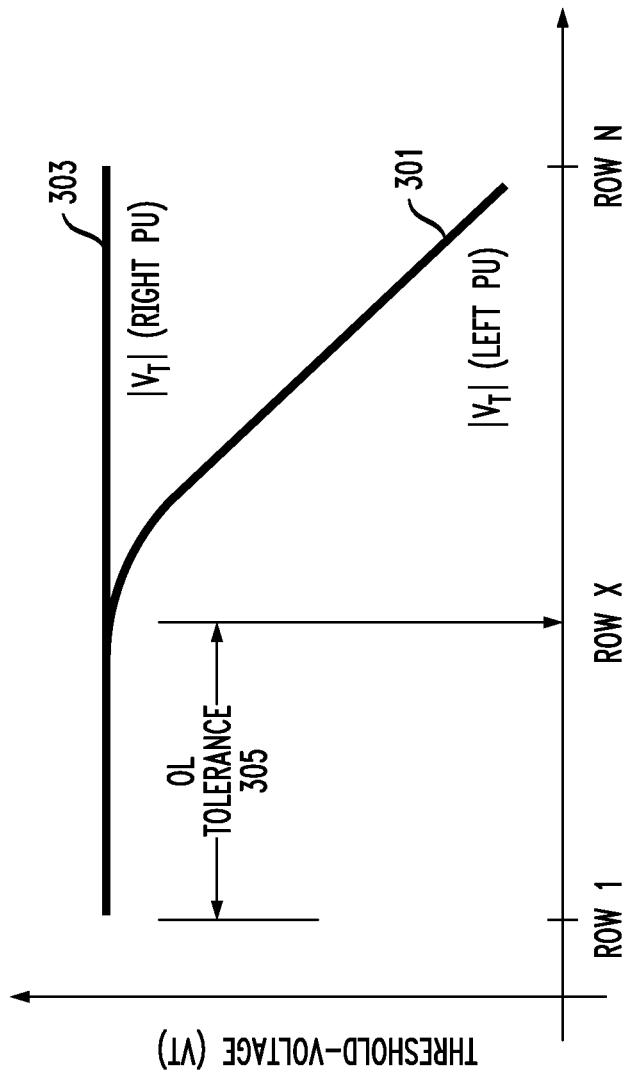
FIG. 3 shows expected characteristics of the design in FIG. 2, in accordance with an aspect of the invention.

FIG. 2 shows an exemplary embodiment with respect to characterizing the impact of the BH mask. In this aspect, a column 251 is designed wherein each row one through N (numbered 253, 255, 257) represents a specific kind of SRAM cell. The BH mask is deliberately shifted by a certain Δ (say 2 nm) in neighboring rows. Note that a mask can be shifted either left-right OR up-down depending on the transistors of interest. The topmost row 253 is a nominally designed SRAM cell and the Nth row 257 will see a deliberate shift of (N−1)Δ. For this design, on each die, the threshold-voltages of each left and right PU PMOS transistor 110, 112 in each row 253, 255, 257 are measured, as shown in FIG. 3. The threshold voltage magnitude |VT| of the left PU 112 will reduce, as seen at 301, due to doping contamination whereas that of the right PU 110 will remain unaffected, as seen at 303. The overlay seen by the die being measured will correspond to the deliberate shift of the row for which the inflection point occurs, e.g. $(X-1)\Delta$ for the $X^{th}$ row.

Thus, this aspect involves measuring the difference in threshold-voltages of the left 112 and right 110 FETs of each SRAM cell. The known deliberate overlay of the row at which inflection occurs (e.g., row X in FIG. 3) is used to determine the actual post-Si misalignment that occurred in each cell. This measurement is undertaken on several dies for characterizing the overlay tolerance 305 of the SRAM cells across the wafer. To the left of Row X, there is little or no difference in the threshold voltages. To the right, there is an increasing and significant difference, leading to asymmetry in the cells.

In another aspect, discussed further below, on-chip monitoring circuits are employed to convert the threshold-voltage shift due to block mask overlay to a corresponding digital value. These on-chip circuits can be used for doing post-manufacturing repair in the dies which exhibit an overlay higher than the tolerance level.

Thus, embodiments of the invention provide a circuit technique to electrically characterize block mask shifts. Overlay variation occurs due to the fabrication tool, while putting a mask on a wafer and carrying out patterning. Overlay occurs between different mask layers. With regard to block mask overlay, mask misalignment leads to doping uncertainty. The impact of block mask overlay includes a condition wherein the intended FET receives less doping while an un-intended FET is contaminated by the dopant. Block overlay is a growing concern with aggressive ground rules, ultra-dense circuits such as SRAM, and reduced FET volumes, implying less dopant and thus a greater need for accurate doping. One or more embodiments advantageously provide accurate electrical characterization of the overlay.

Figure 4:
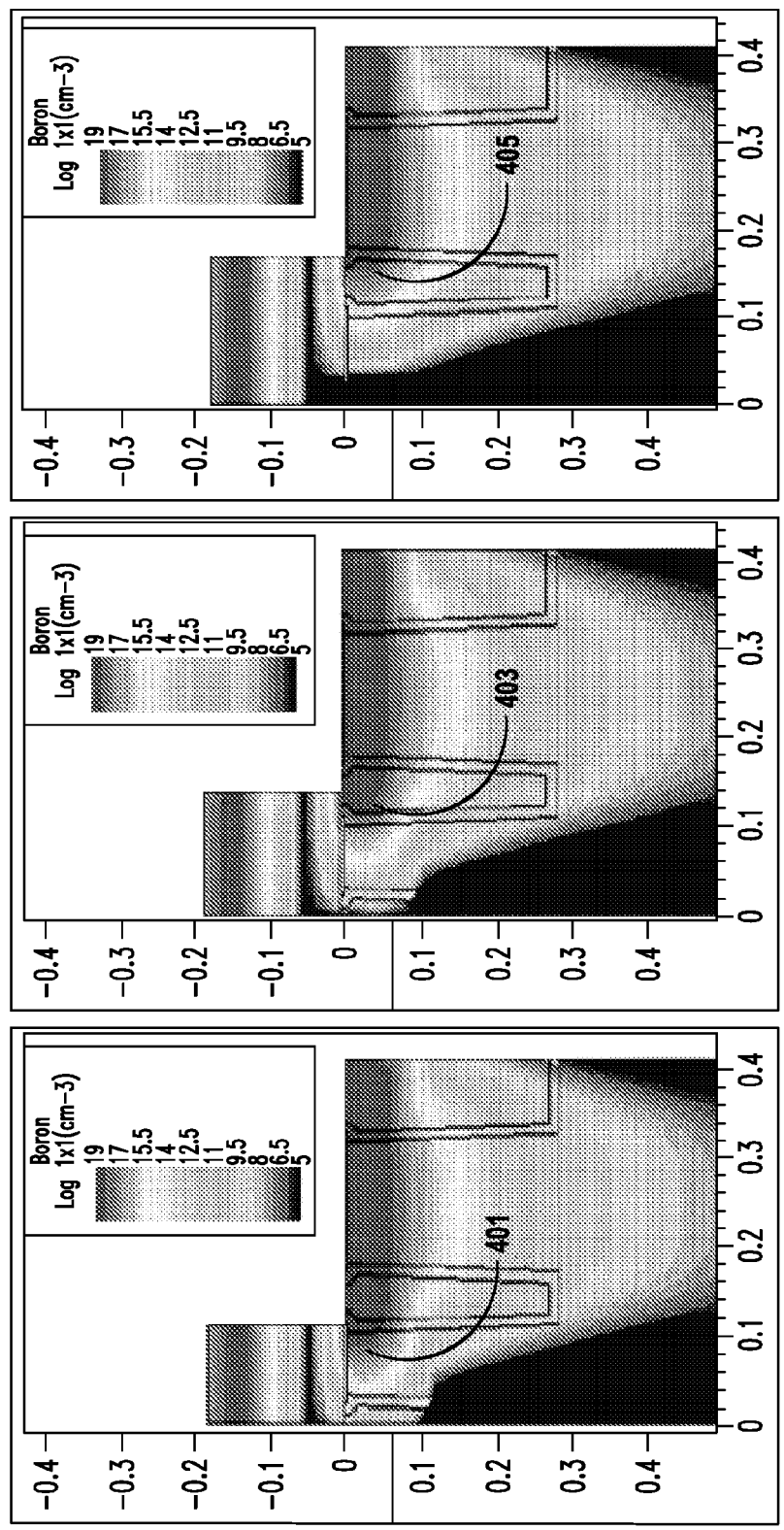
FIG. 4 shows an example of the impact of block mask overlay.

FIG. 4 shows exemplary variation in Boron dopant due to block mask overlay. Note the rightward movement of the edge of the highly-doped region, as seen at 401, 403, and 405.

Figure 5:
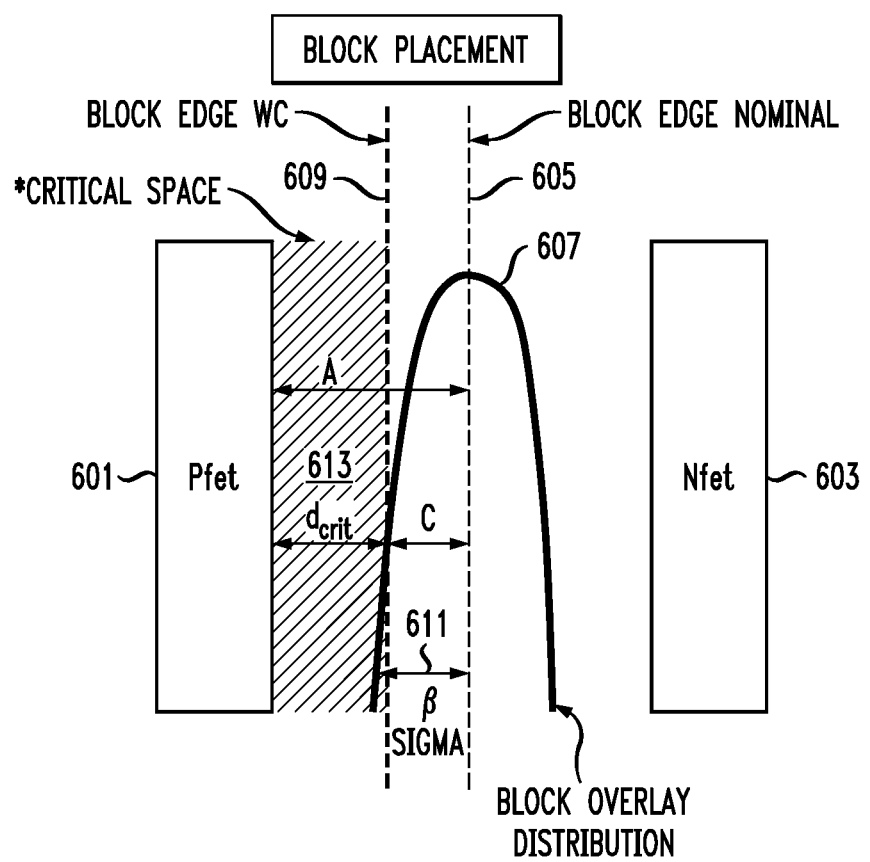
FIG. 5 is a schematic showing how reducing NFET and PFET distance reduces the so-called "critical space"

FIG. 5 shows certain pertinent parameters for block placement. A PFET 601 is spaced apart from an NFET 603. Dotted line 605 shows the nominal location of the block edge. Curve 607 is a statistical normal distribution depicting the placement of the actual location of the block edge. Dotted line 609 shows the worst-case location for the block edge. A is the distance between the right-hand edge of the PFET 601 and the nominal block edge. The parameter $d_{crit}$ is the distance between the right-hand edge of the PFET 601 and the worst-case block edge. C is the distance between the worst case and nominal block edges. As is well-known from statistics, nearly all (99.73%) of the values lie within 3 standard deviations (3 sigma) of the mean. Here, the 3-sigma value is shown at 611; the worst case line 609 as defined in this example will encompass less than 99.73% of all the values. The so-called critical space is the cross-hatched region 613 between the right-hand edge of the PFET 601 and the worst case bock edge 609. The block edge should not infringe on this region 613.

It will be appreciated that without block mask overlay, threshold voltage mis-match, called $Vt_{MM} = |Vt_{left} - Vt_{right}|$, is due to intrinsic random dopant fluctuation (RDF) only. Furthermore, block mask overlay has no effect unless a neighboring FET gets spill-over dopants. For example, as seen in FIG. 5, an absolute value of the overlay (|OL|) less than 20 nm (distance "C" in FIG. 5) does not contaminate a neighboring transistor in the given example. Contamination is due to dopant, and thus random behavior of dopants introduces threshold voltage mis-match. Note that the threshold voltage of either the left or right side FET is affected in any given cell; the other FET has only the intrinsic RDF.

Thus, in one or more embodiments, obtain OL and $Vt_{MM}$ data from actual block level overlay splits with intentional level shifts for multiple chips, wafers, and/or lots.

Figure 6:
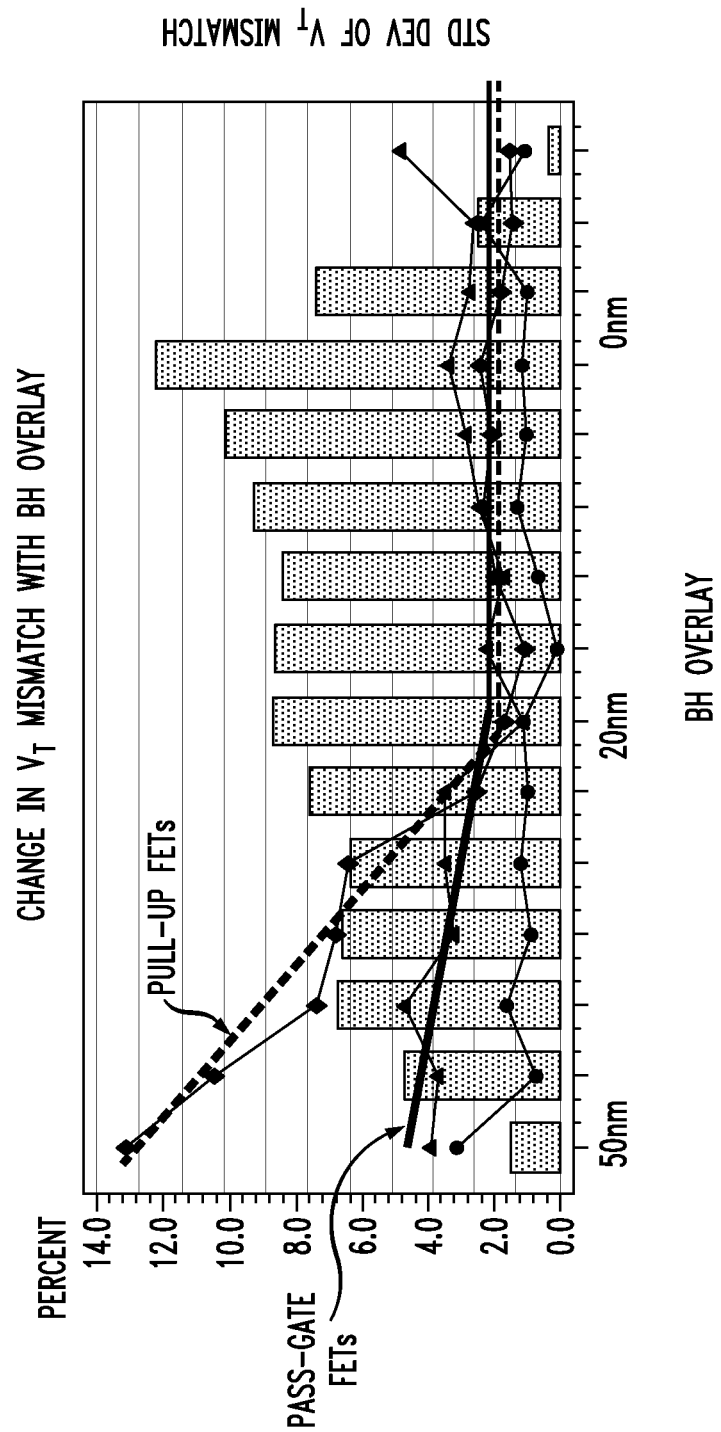
FIG. 6 is a bar graph showing change in the standard deviation of the threshold voltage due to BH mask misalignment.

FIG. 6 shows a bar graph of change in threshold voltage mismatch ($Vt_{MM}$) standard deviation versus overlay values. The right-hand axis is the threshold voltage standard deviation for each overlay value while the left-hand axis is the corresponding percentage. It shows that for overlay less than 20 nm (or, in general, a certain critical value based on a specific block mask layer and field-effect transistor under consideration), the standard deviation of $Vt_{MM}$ does not change with overlay and hence, corresponds to the mismatch due to random-dopant fluctuations. As overlay increases beyond 20 nm, mismatch between left and right pull-up transistors increases. Also, the mismatch between left and right pull-down transistors increases. Mismatch increases with overlay because a transistor on one side only (either left or right) gets affected while the other remains unchanged and sees only RDF-induced threshold-voltage variation.

Figure 7:
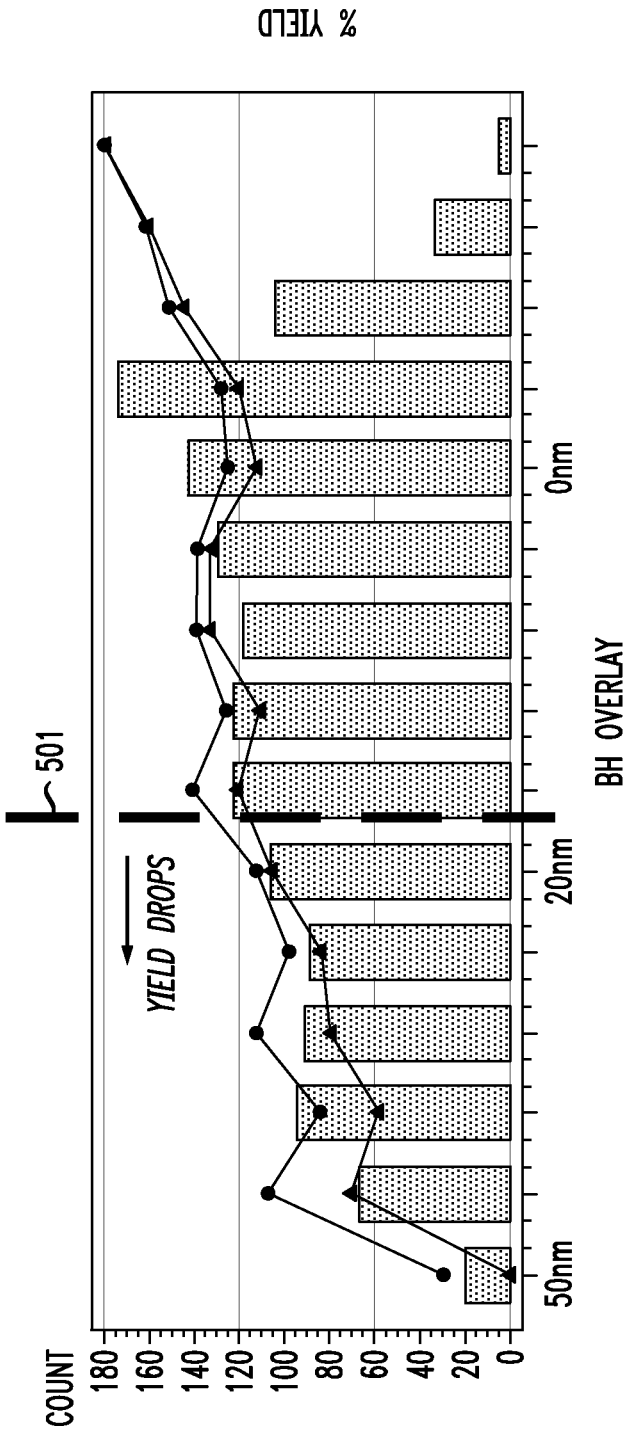
FIG. 7 is a bar graph showing how yield drops for BH blocking mask overlay greater than 20 nm.

FIG. 7 shows a bar graph of BH mask overlay (for doping NFET) versus yield. The left-hand axis is the count of samples for each Y-value while the right-hand axis is the corresponding yield. As seen at the dotted line 501, the yield drops for BH overlay (OL)>20 nm. This correlates in a manner similar to the increase in threshold voltage mismatch sigma shift seen in FIG. 6. It is worth noting that the NFET-to-PFET distance reduces by almost 70% every technology generation, thereby emphasizing the significance of characterizing and controlling block mask overlay.

Exemplary requirements in scaled technologies will now be considered. For a given fabrication tool, it is desirable to be able to analyze the electrical impact of overlay during the technology ramp-up cycle. Pertinent issues include how much overlay varies across a wafer and within a die; and the electrical impact of overlay. With regard to the latter, issues include how the electrical impact varies for circuit design blocks (worst-case on a die); knowledge of electrical impact also is desirable for estimating the stripping bound for resist.

Technology characterization is of interest in one or more embodiments. One significant aspect is the allowed minimum spacing between the active diffusion layers of NFET and PFET. This can be important, for example, in PU and PD devices in SRAMs, latches, and the like. One or more embodiments permit determination of the required block mask compensation to compensate for contamination of one FET over another. One or more embodiments take into consideration allowed design rules.

One or more embodiments enable the above analysis by permitting accurate measurement and characterization of the overlay.

Figure 8:
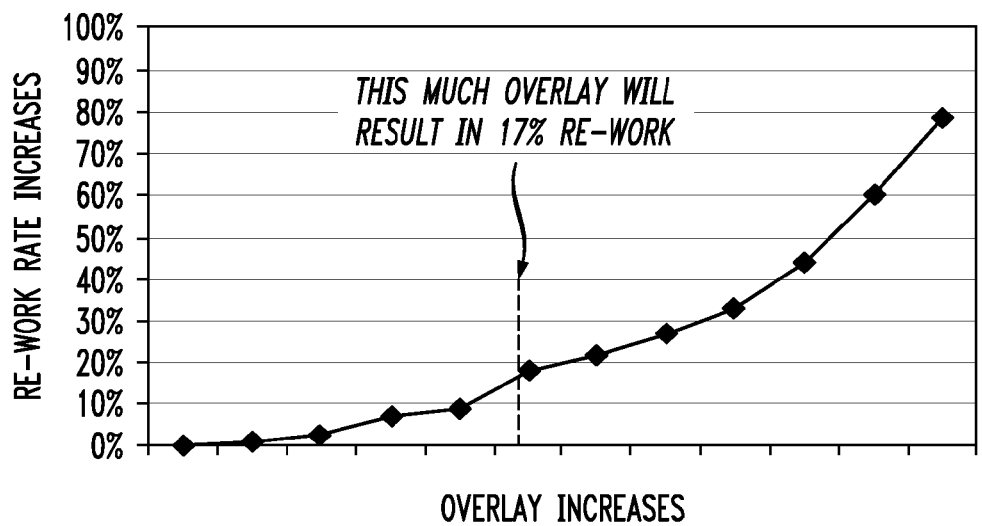
FIG. 8 is a graph showing the rework rate (percentage) plotted against the overlay tolerance in nm.

FIG. 8 plots rework rate versus overlay. Overlay is continuously monitored during the fabrication and if it increases beyond certain specified limit, the particular fabrication step is re-done. As shown in FIG. 8 for illustration, if overlay increases, the amount of re-work also increases.

One or more embodiments address block mask overlay issues in a variety of contexts; by way of a non-limiting example, in 32 nm and 22 nm technologies. It is worth noting that other overlay issues such as PC, CA, and RX are known and being addressed; for these issues, it is easier to determine the impact. For example, it is possible to measure FET characteristics such as drain-source current versus gate-source voltage (Ids-Vgs) for several FETs. Optical measurements can also be used.

One or more embodiments advantageously separate out other effects of process variations from block mask overlay issues; provide direct correlation of overlay to electrical characteristics; and/or provide small FET structures for characterizing overlay in products.

One or more embodiments include designs of special SRAM cells based on the core SRAM cell layout with deliberately shifted block doping masks to isolate devices of interest. The difference in threshold-voltages of left and right FETs of each SRAM cell is measured. The known deliberate overlay is used to determine the actual post-Si misalignment that happened in each cell. Measurement is carried out on several dies for characterizing and increasing OL tolerance of the SRAM cell(s) across the wafer. One or more embodiments include the design of an on-chip monitor to convert the threshold-voltage shift due to block OL to a corresponding digital value. This enables post-Si repair using techniques, such as adaptive body-biasing, using redundant cells, and so on which are known in and of themselves.

Figure 9:
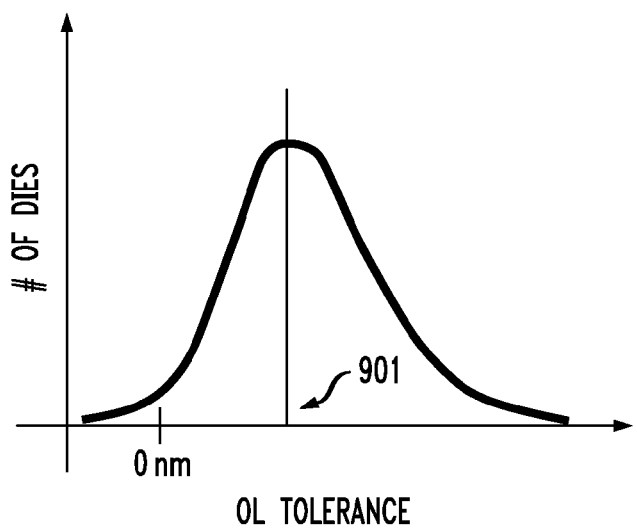
FIG. 9 is a plot of number of dies versus overlay tolerance depicting the desirability of minimizing the number of dies with negative overlay tolerance.

Recalling the above discussion of FIG. 3, and turning now to FIG. 9, it is desirable to make sure that the mean 901 of OL tolerance is high enough to minimize the number of dies with negative OL tolerance. This can be done by increasing the distance between the NFET & PFET; improving the fabrication process; trading-off OL tolerance of one FET with another (say, PD is more crucial than PU); and/or re-tuning the SRAM FET size(s) to make it/them OL tolerant.

Figure 10:
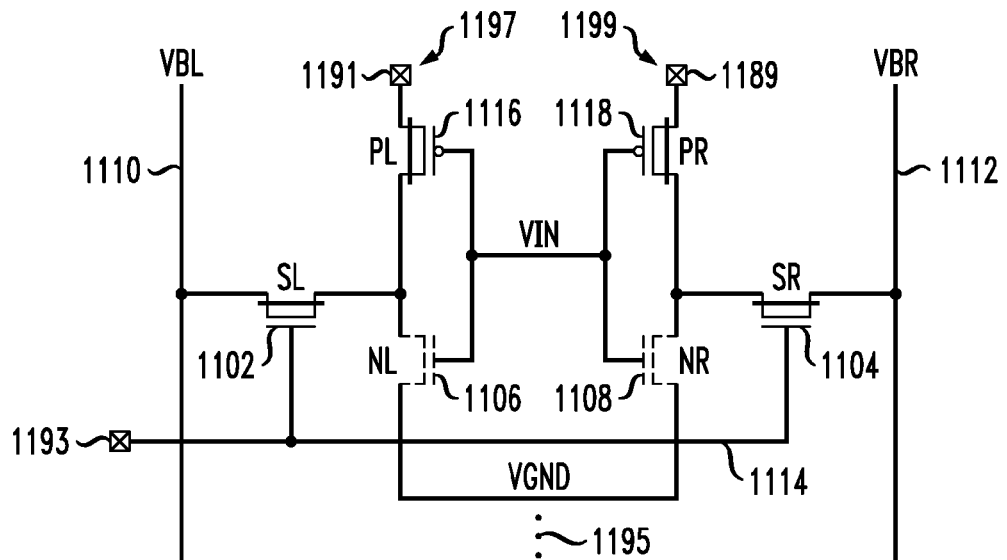
FIG. 10 is a schematic of a circuit for determining overlay error in pull-downs, in accordance with an aspect of the invention.

FIG. 10 shows a circuit that can be used to determine OL error in the pull-down transistors. Like a conventional 6-transistor SRAM cell, the cell in FIG. 10 includes four transistors NL, NR, PL, and PR, numbered 1106, 1108, 1116, and 1118 respectively, that form two inverters 1197, 1199. However, the inverters are not cross-coupled as in a conventional 6-transistor SRAM cell. Rather, all the four gates of transistors 1106, 1108, 1116, and 1118 are coupled together. Two additional access transistors SL and SR, numbered 1102 and 1104, are present as in a conventional six transistor cell. Note word line 1114 and true and complementary bit lines 1110, 1112. The voltages of the latter are VBL, VBR, respectively. The terminals 1189, 1191, 1193, with the "X in a box" symbol, are not connected to anything.

As indicated by the ellipsis 1195, the cell in FIG. 10 is part of a dummy column (with shorted pass-gates 1102, 1104 and pull-ups 1116, 1118. This column can be used to characterize the difference in threshold-voltages between left and right pull-down transistors to the amount of block shift. The dummy column is connected in parallel to reduce RDF-induced threshold voltage variations. This can advantageously be accomplished in the layout without disturbing doping masks. One method of determining threshold-voltage is to apply a voltage VDD at the drain terminals of left (VBL) and right pull-down (VBR) transistors while keeping source terminals (VGND) at zero voltage. The voltage VIN (applied at the gate of left pass-gate transistor) is increased to obtain a voltage at which a specified current flows through the drain of left pull-down transistor (this is called its threshold-voltage). Similarly, threshold-voltage of right pull-down transistor is obtained. If NL 1106 gets contaminated, its threshold voltage reduces. If NR 1108 gets contaminated, its threshold voltage reduces.

Figure 11:
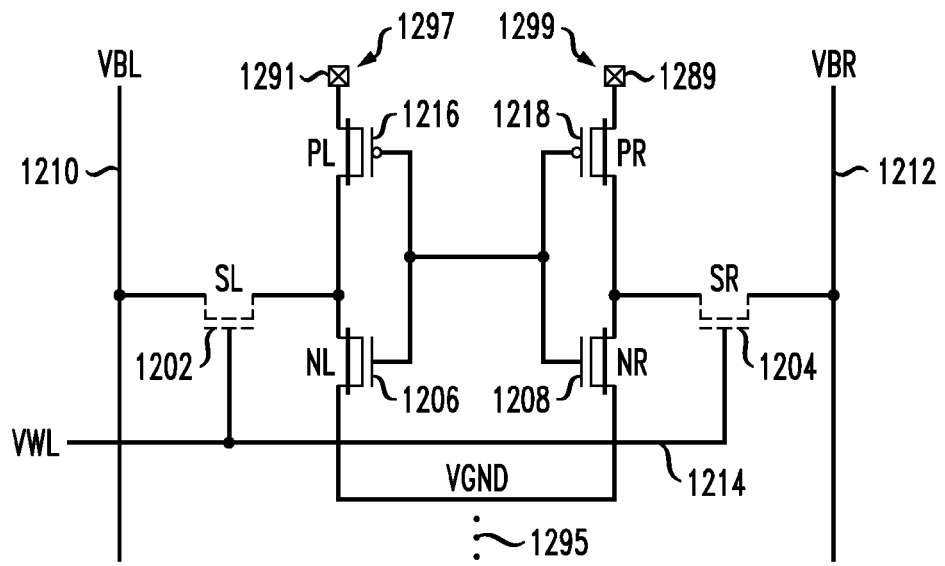
FIG. 11 is a schematic of a circuit for determining overlay error in pass-gates, in accordance with an aspect of the invention.

FIG. 11 shows a circuit that can be used to determine OL error in the pass gates. Like a conventional 6-transistor SRAM cell, the cell in FIG. 11 includes four transistors NL, NR, PL, and PR, numbered 1206, 1208, 1216, and 1218 respectively, that form two inverters 1297, 1299. However, the inverters are not cross-coupled as in a conventional 6-transistor SRAM cell. Rather, all the four gates of transistors 1206, 1208, 1216, and 1218 are coupled together. Two additional access transistors SL and SR, numbered 1202 and 1204, are present as in a conventional six transistor cell. Note word line 1214 and true and complementary bit lines 1210, 1212. The voltage of the former is VWL while the voltages of the latter are VBL, VBR, respectively. The terminals 1289, 1291, with the "X in a box" symbol, are not connected to anything.

As indicated by the ellipsis 1295, the cell in FIG. 11 is part of a dummy column (with shorted pull-downs 1206, 1208 and pull-ups 1216, 1218). This column can be used to characterize the difference in threshold-voltage shifts between left and right pass-gate transistors. The dummy column is connected in parallel to reduce RDF-induced threshold voltage variations. This can advantageously be accomplished in the layout without disturbing doping masks. One method of determining threshold-voltage is to apply a voltage VDD at the drain terminals of left (VBL) and right pass gate (VBR) transistors while keeping source terminals (VGND) at zero voltage. The voltage VWL (applied at the gate of left pass-gate transistor) is increased to obtain a voltage at which a specified current flows through the drain of left pass-gate transistor (this is called its threshold-voltage). Similarly, threshold-voltage of right pass-gate transistor is obtained. If SL 1202 gets contaminated, its threshold voltage reduces. If SR 1204 gets contaminated, its threshold voltage reduces.

Figure 12:
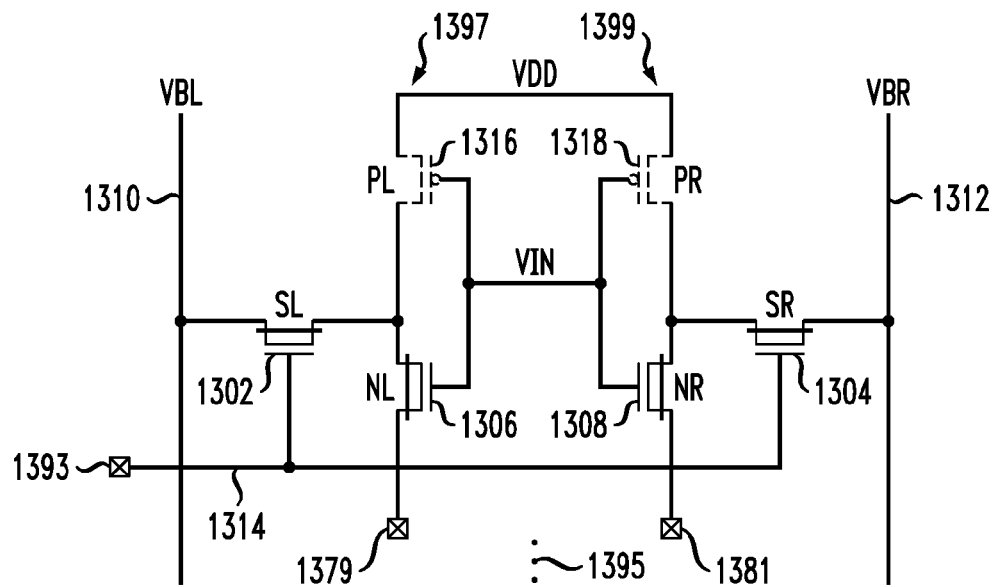
FIG. 12 is a schematic of a circuit for determining overlay error in pull-ups, in accordance with an aspect of the invention.

FIG. 12 shows a circuit that can be used to determine OL error in the pull-up transistors. Like a conventional 6-transistor SRAM cell, the cell in FIG. 12 includes four transistors NL, NR, PL, and PR, numbered 1306, 1308, 1316, and 1318 respectively, that form two inverters 1397, 1399. However, the inverters are not cross-coupled as in a conventional 6-transistor SRAM cell. Rather, all the four gates of transistors 1306, 1308, 1316, and 1318 are coupled together. Two additional access transistors SL and SR, numbered 1302 and 1304, are present as in a conventional six transistor cell. Note word line 1314 and true and complementary bit lines 1310, 1312. The voltages of the latter are VBL, VBR, respectively. The terminals 1379, 1381, 1393, with the "X in a box" symbol, are not connected to anything.

As indicated by the ellipsis 1395, the cell in FIG. 12 is part of a dummy column (with shorted pass-gates 1302, 1304 and pull-downs 1306, 1308. The dummy column is connected in parallel to reduce RDF-induced threshold voltage variations. This can advantageously be accomplished in the layout without disturbing doping masks. One method of determining threshold-voltage is to apply a voltage VDD at the source terminals of left and right pull up transistors while keeping drain terminal of left pull up at VBL and right pull up at VBR. The voltage VIN (applied at the gate of left pull-up transistor) is increased to obtain a voltage at which a specified current flows through the drain of left pull-up transistor (this is called its threshold-voltage). Similarly, threshold-voltage of right pull up transistor is obtained. If PL 1316 gets contaminated, its threshold voltage reduces. If PR 1318 gets contaminated, its threshold voltage reduces.

A number of readout schemes can be utilized to detect VBL−VBR. In one approach, this is done by directly accessing the 3 terminals of each FET. Note the schematics of FIGS. 10-12: the terminals of each FET are accessible and can be used to directly measure the threshold-voltage of each FET. This is useful during the characterization phase while determining the OL tolerance of an SRAM cell and the OL error of a fabrication process. A simple test setup can be employed and other characteristics such as the ON- and OFF-currents of each FET can also be measured.

In another approach, readout can be carried out by implementing readout circuitry to obtain a voltage corresponding to the difference VBL−VBR. An integrated readout circuitry is useful to carry out on-chip monitoring of the block OL in a product-like design, and is fast and efficient.

Figure 13:
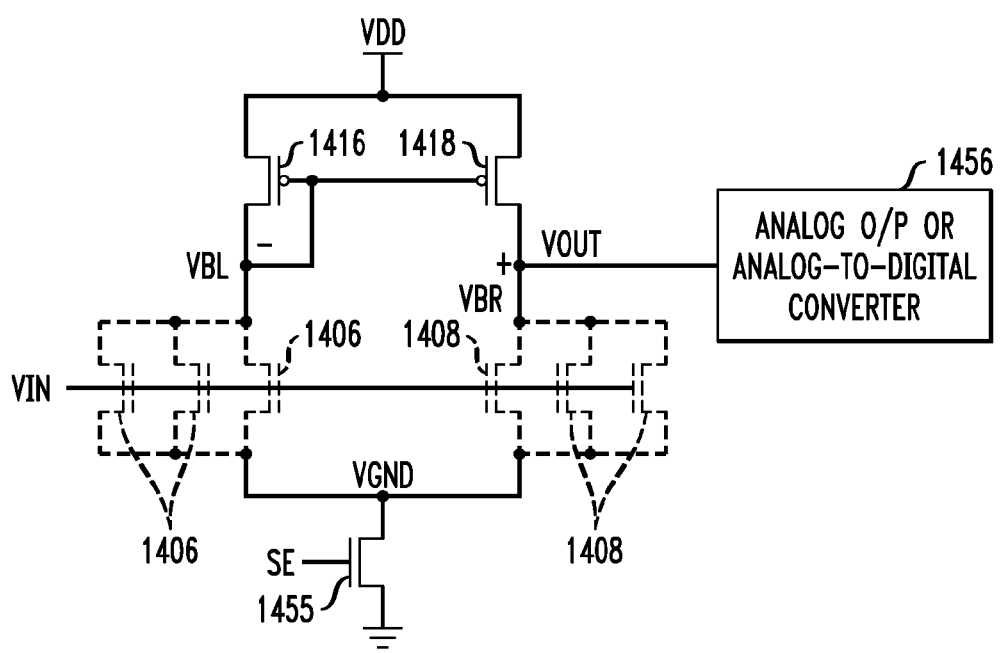
FIG. 13 is a schematic of a circuit for measuring change in threshold voltage, in accordance with an aspect of the invention.

FIG. 13 depicts one exemplary scheme for measuring the difference in the threshold voltages. Included are four transistors NL, NR, PL, and PR, numbered 1406, 1408, 1416, and 1418 respectively. Note true and complementary bit line voltages VBL, VBR, respectively. The two gates of transistors 1416, 1418 are coupled together and coupled to the true bit line. The gates of transistors 1406, 1408 are coupled together and coupled to the input voltage VIN. The terminal VGND is selectively grounded by turning NFET 1455 on with signal SE on its gate. In this scheme, RDF-induced threshold voltage fluctuations are minimized by carrying out DC measurements and connecting 100+ cells together, as indicated by the numerous transistors NL, NR, numbered 1406, 1408, and shown in phantom lines, indicating many such transistors connected to the input voltage VIN. The voltage VIN is set such that the equivalent transistors 1406 and 1408 are biased in saturation mode. In saturation mode, the drain-to-source current $I_{DS}$ is proportional to $(V_{GS}-V_T)$, where $V_{GS}$=VIN−VGND. The output voltage VOUT is the difference between VBR and VBL. VOUT is read using an analog output or analog-to-digital converter, as seen at 1456.

Figure 14:
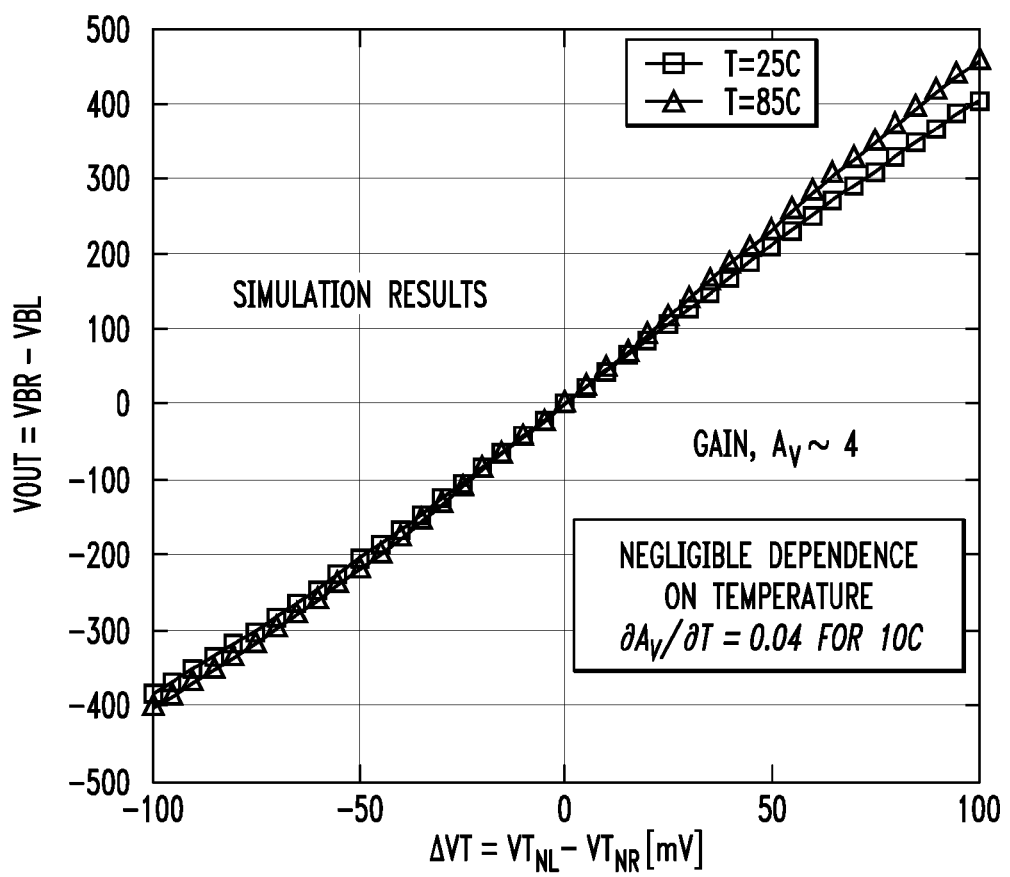
FIG. 14 is a graph of output voltage versus change in threshold voltage.

FIG. 14 shows exemplary simulation results, with output voltage (VOUT=VBR−VBL) plotted versus change in threshold voltage between NL 1406 and NR 1408. Due to overlay, if there is a difference in threshold-voltage between left and right sides, a corresponding change in VOUT will be obtained. There is negligible temperature dependence in this example, as the partial derivative of the gain, $A_V$, with respect to temperature is only 0.04 at 10 C.

Figure 15:
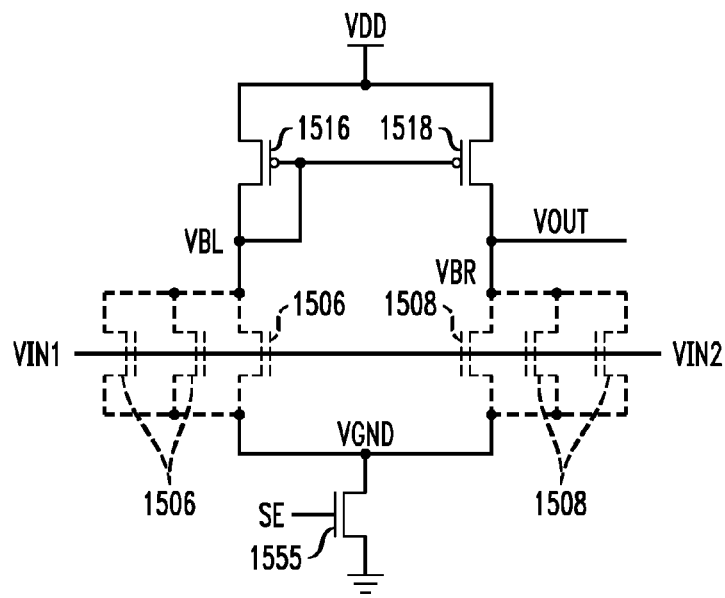
FIG. 15 is a schematic of a gain independent circuit, in accordance with an aspect of the invention.

FIG. 15 shows a gain-independent structure. Included are four transistors NL, NR, PL, and PR, numbered 1506, 1508, 1516, and 1518 respectively. Note true and complementary bit line voltages VBL, VBR, respectively. The two gates of transistors 1516, 1518 are coupled together and coupled to the true bit line. The terminal VGND is selectively grounded by turning NFET 1555 on with signal SE on its gate. In this scheme, RDF-induced threshold voltage fluctuations are minimized by carrying out DC measurements and connecting 100+ cells together, as indicated by the numerous transistors NL, NR, numbered 1506, 1508, and shown in phantom lines. Many such transistors 1506 are connected to a first input voltage VIN1, and many such transistors 1508 are connected to a second input voltage VIN2. In this approach, sweep VIN1 (with fixed VIN2) until VOUT=0. This implies that ΔVT=VIN1−VIN2. This approach employs a digital-to-analog converter (DAC) for VIN1 instead of an analog-to-digital converter (ADC) (as in FIG. 13). DAC is used to generate a specified voltage VIN1. A DAC is cheaper to make as compared to an ADC.

Figure 16:
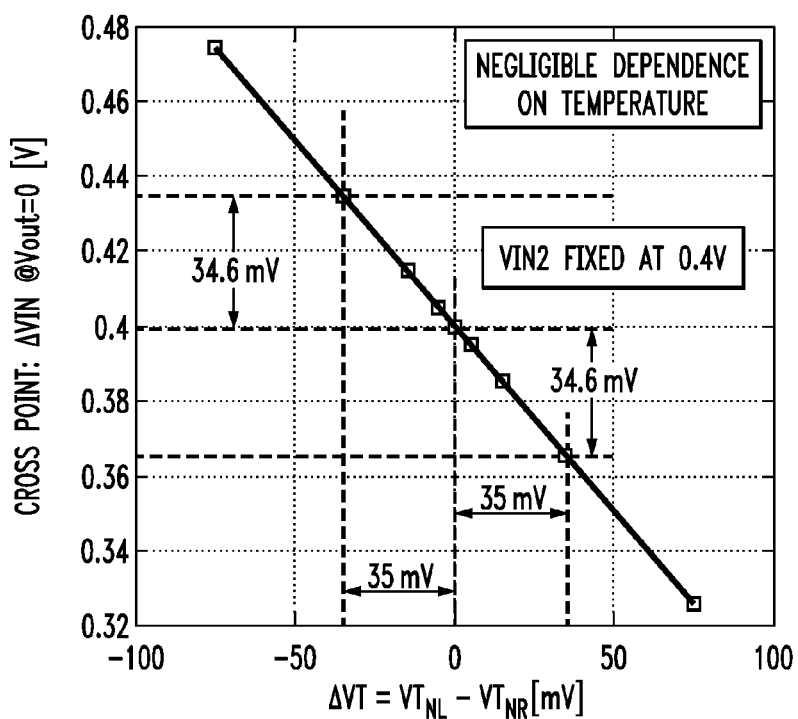
FIG. 16 is a graph of change in input voltage versus change in threshold voltage.

FIG. 16 shows exemplary simulation results, with the cross point (ΔVIN at VOUT=0) plotted versus change in threshold voltage between NL 1506 and NR 1508. There is negligible temperature dependence in this example.

Figure 17:
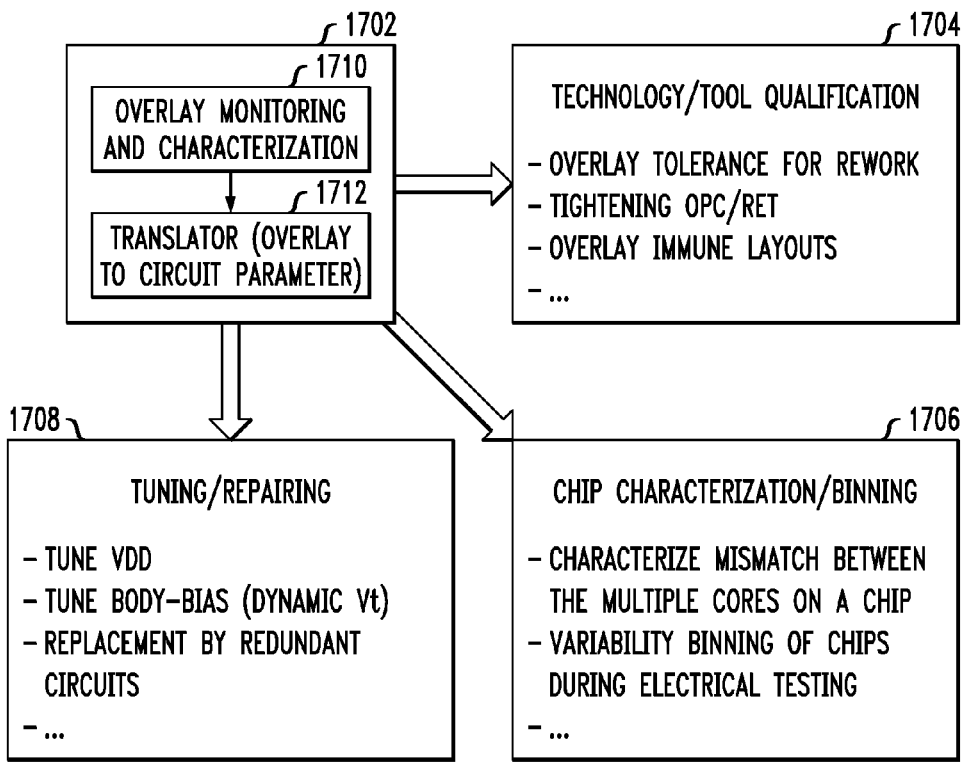
FIG. 17 is a flow chart of on-chip circuit parameter tuning and chip binning, in accordance with an aspect of the invention.

FIG. 17 is a flow chart of on-chip circuit parameter tuning and chip binning. Block 1702 shows overlay monitoring and characterization at 1710 and use of a translator at 1712. The translator translates the overlay characteristics to circuit parameters. The process in block 1702 can be used for a variety of purposes. As seen at 1704, it can be used for technology and/or tool qualification. Pertinent aspects include overlay tolerance for rework, tightening of Optical Proximity Correction (OPC) and/or Resolution Enhancement Techniques (RET), developing overlay immune layouts, and the like. As seen at 1706, the process in block 1702 can be used for chip characterization and/or binning; for example, to characterize mismatch between the multiple cores on a chip, to carry out variability binning of chips during electrical testing, and the like. As seen at 1708, the process in block 1702 can be used for tuning and/or repairing; for example, to tune VDD, tune the body bias (dynamic threshold voltage), replacement by redundant circuits, and the like.

One or more embodiments are useful during technology ramp-up for tool qualification and/or characterization, and/or for ground rule characterization (RX to Nwell and minimum n-p distances). One or more embodiments provide faster design closure with accurate overlay models. One or more embodiments enable potential on-chip adaptive schemes, with increased robustness and yield. One or more embodiments provide overlay distribution information, which is useful in process and/or layout quality measurements and/or for statistical yield analysis.

One or more embodiments provide a method for electrically characterizing whether a block mask has experienced any shifting. The method includes measuring the amount of doping change from a target value that the device under test has experienced; using threshold voltage shift measurements to determine and characterize the amount of block mask shift (and therefore the amount of doping change); using specially designed SRAM cells with deliberately shifted block doping masks to characterize the threshold voltage shifts; performing the characterization on several die across the wafer; and designing an on-chip monitor to convert the threshold voltage shift to a corresponding digital value to determine if compensatory post-silicon steps need be taken.

In one or more embodiments, electrical measurements are taken on several deliberately shifted shapes to characterize the misalignment. In one or more embodiments, the block mask shift induced threshold voltage variation is electrically measured after fabrication. The impact of block mask misalignment is analyzed in SRAM cells. One or more embodiments electrically characterize the impact of block mask shifts on SRAM cell stability. One or more embodiments measure block mask overlay by creating several deliberately shifted overlay FETs and measuring the cross-over point. One or more embodiments are direct and model-free. One or more embodiments measure the threshold voltage by making several differential test structures for characterizing block mask overlay in SRAMs.

Thus, by way of review and provision of additional background, block mask (for FET doping) misalignment can lead to insufficient dopants in target FETs as well as contamination of unwanted neighboring FETs. It is a growing concern in ultra-dense structures such as SRAMs. Any contamination of dopants leads to variation in threshold voltage. It is observed from the hardware that this variation is not negligible in the 32 and 22 nm technology nodes. Current methods of measuring block mask overlay involve optical measurements followed by measuring Ids-Vgs characteristics of a FET. It is impossible to correlate optical and electrical measurements because optical measurement sites are on the kerf whereas electrically measured FETs are inside the chip area. Further, this is a time consuming process.

One or more embodiments provide a test structure which is easy to manufacture and can effectively correlate overlay measurements to electrical measurements (as they are the same). One or more embodiments employ differential analog measurements to generate an electrical signal corresponding to the overlay. This electrical signal can be used to characterize technology during the ramp-up phase and can also be used in products to carry out on-chip correction and tuning.

Recapitulation

Given the discussion thus far, it will be appreciated that, in general terms, an exemplary method of characterizing block mask overlay tolerance of an integrated circuit design, according to an aspect of the invention, includes the step of obtaining a physical test integrated circuit having a plurality of repeating circuit portions (e.g., rows in FIG. 2) corresponding to the integrated circuit design. A first of the portions (e.g., Row 1 in FIG. 2, numbered 253) is fabricated with a nominal block mask location. Additional ones of the portions (e.g., Rows 2-N in FIG. 2, numbered 255, 257) are deliberately fabricated with predetermined progressive increased offset of the block mask location from the nominal block mask location. For each of the portions, the difference in threshold voltage between a first field effect transistor and a second field effect transistor is determined (e.g., left PU and right PU, as in FIG. 3). The predetermined progressive increased offset of the block mask location is in a direction from the first field effect transistor to the second field effect transistor (e.g., left to right as in FIG. 2). A further step includes determining the block mask overlay tolerance 305 at the value of the progressive increased offset corresponding to the inflection of the difference in threshold voltage from a zero difference. In the ideal case, a single point of inflection would occur i.e., line 301 intersecting line 303 at a single clear point. However, due to fabrication imperfections, some noise would likely be seen and interpolation would likely be needed to determine the point of inflection. A variety of interpolation techniques can be used to fit to the data for line/curve 301 and determine the intersection point with line 303; for example, a linear least-squares fit, a second order, third order, or higher order fit; an exponential fit, and so on.

In some instances, the obtaining step includes fabricating the physical test integrated circuit. In other cases, a different party could fabricate the test circuit.

In one or more embodiments, the integrated circuit design includes a static random access memory (SRAM) and the fabricating includes fabricating the repeating circuit portions as test static random access memory cells.

The difference in threshold voltage could be determined, for example, between the pull-down transistors, the pull-up transistors, and the pass gate transistors.

The circuits of FIGS. 10-12 can be used for the initial characterization during design development (with an external tester) and can also be used for on-chip monitoring on actual production chips, together with the circuits of FIGS. 13 and/or 15.

So, for example, in some cases (e.g., FIG. 10), in the step of determining the difference in threshold voltage between the first field effect transistor and the second field effect transistor, the first field effect transistor includes one of a left-hand pull-down transistor 1106 and a right-hand pull-down transistor 1108, and the second field effect transistor includes another one of the left-hand pull-down transistor 1106 and the right-hand pull-down transistor 1108. In such cases, the fabricating of the repeating circuit portions as test static random access memory cells includes fabricating the test static random access memory cells as six-transistor cells modified as in FIG. 10. That is to say, the left-hand pass gate transistor 1102 and the right-hand pass gate transistor 1104 are shorted. The left-hand pull-up transistor 1116 and the right-hand pull-up transistor 1118 are shorted. An input voltage node VIN is provided by electrically connecting gates of the left-hand pull-up transistor 1116, the right-hand pull-up transistor 1118, the left-hand pull-down transistor 1106, and the right-hand pull-down transistor 1108.

In other cases (e.g., FIG. 12), in the step of determining the difference in threshold voltage between the first field effect transistor and the second field effect transistor, the first field effect transistor includes one of a left-hand pull-up transistor 1316 and a right-hand pull-up transistor 1318, and the second field effect transistor includes another one of the left-hand pull-up transistor 1316 and the right-hand pull-up transistor 1318. In such cases, the fabricating of the repeating circuit portions as test static random access memory cells includes fabricating the test static random access memory cells as six-transistor cells modified as in FIG. 12. That is to say, the left-hand pass gate transistor 1302 and the right-hand pass gate transistor 1304 are shorted. The left-hand pull-down transistor 1306 and the right-hand pull-down transistor 1308 are shorted. An input voltage node VIN is provided by electrically connecting gates of the left-hand pull-up transistor 1316, the right-hand pull-up transistor 1318, the left-hand pull-down transistor 1306, and the right-hand pull-down transistor 1308.

In still other cases (e.g., FIG. 11), in the step of determining the difference in threshold voltage between the first field effect transistor and the second field effect transistor, the first field effect transistor includes one of a left-hand pass gate transistor 1202 and a right-hand pass gate transistor 1204, and the second field effect transistor includes another one of the left-hand pass gate transistor 1202 and the right-hand pass gate transistor 1204. In such cases, the fabricating of the repeating circuit portions as test static random access memory cells includes fabricating the test static random access memory cells as six-transistor cells modified as in FIG. 11. That is to say, the left-hand pull-up transistor 1216 and the right-hand pull-up transistor 1218 are shorted; the left-hand pull-down transistor 1206 and the right-hand pull-down transistor 1208 are shorted; and gates of the left-hand pull-up transistor 1216, the right-hand pull-up transistor 1218, the left-hand pull-down transistor 1206, and the right-hand pull-down transistor 1208 are electrically interconnected. Furthermore, the word line 1214 is electrically interconnected with gates of the left-hand pass gate transistor 1202 and the right-hand pass gate transistor 1204.

As seen, for example, in FIG. 2, in some cases, the fabricating includes fabricating the plurality of repeating circuit portions in a column 251 with a plurality of rows 253, 255, 257. The first of the portions is fabricated in a first of the rows 253, and the additional ones of the portions are fabricated in additional ones of the rows (row 2 to row N, 255, 257). The predetermined progressive increased offset of the block mask location from the nominal block mask location is a uniform increase (Δ) for each successive one of the rows.

In the step of determining the difference in threshold voltage between the first field effect transistor and the second field effect transistor, the direction from the first field effect transistor to the second field effect transistor can be, for example:

left to right or right to left (i.e., parallel to an x-axis); or up to down or down to up (i.e., parallel to a y-axis).

As noted, in addition to characterization of overlay tolerance and the like during design, aspects of the invention contemplate on-chip monitoring circuitry for actual production chips. Thus, in some instances, the method further includes obtaining an actual integrated circuit conforming to the integrated circuit design. The actual integrated circuit has formed thereon on-chip monitoring circuitry (see, e.g., FIGS. 13 and 15) configured to determine threshold voltage difference between at least two actual transistors on the actual integrated circuit. Further steps include measuring the threshold voltage difference between the at least two actual transistors on the actual integrated circuit, and determining actual block mask overlay in the actual integrated circuit by correlating the measured threshold voltage difference to results from the design phase (e.g., results shown in FIG. 3).

In some cases, the step of obtaining the actual integrated circuit includes fabricating the actual integrated circuit. In other cases, a different party could fabricate the circuit.

Referring to FIG. 13, in some cases, the fabricating includes forming the on-chip monitoring circuitry as a plurality of repeating circuit structures. Each of the repeating circuit structures in turn includes a left-hand p-type field effect transistor 1416 having a first drain-source terminal coupled to a supply voltage node $V_{DD}$, a gate, and a second drain source terminal coupled to the gate; a right-hand p-type field effect transistor 1418 having a first drain-source terminal coupled to the supply voltage node, a gate coupled to the gate of the left-hand p-type field effect transistor, and a second drain source terminal; a left-hand n-type field effect transistor 1406 having a first drain-source terminal coupled to the second drain source terminal of the left-hand p-type field effect transistor; a gate, and a second drain source terminal coupled to a selective ground (transistor 1455 selectively grounds the VGND node, e.g.); and a right-hand n-type field effect transistor 1408 having a first drain-source terminal coupled to the second drain source terminal of the right-hand p-type field effect transistor; a gate, and a second drain source terminal coupled to the selective ground. The gates of the left-hand n-type field effect transistors and the right-hand n-type field effect transistors are interconnected with an input voltage terminal VIN. The measuring includes measuring an output voltage VOUT at the second drain source terminal of the right-hand p-type field effect transistor. It will be appreciated that an average value is effectively measured, to isolate the effects of block mask shift and average out the effect of statistical variations such as RDF.

Referring to FIG. 15, in some cases, the fabricating includes forming the on-chip monitoring circuitry as a plurality of repeating circuit structures. Each of the repeating circuit structures in turn includes a left-hand p-type field effect transistor 1516 having a first drain-source terminal coupled to a supply voltage node $V_{DD}$, a gate, and a second drain source terminal coupled to the gate; a right-hand p-type field effect transistor 1518 having a first drain-source terminal coupled to the supply voltage node, a gate coupled to the gate of the left-hand p-type field effect transistor, and a second drain source terminal; a left-hand n-type field effect transistor 1506 having a first drain-source terminal coupled to the second drain source terminal of the left-hand p-type field effect transistor; a gate, and a second drain source terminal coupled to a selective ground (transistor 1455 selectively grounds the VGND node, e.g.); and a right-hand n-type field effect transistor 1508 having a first drain-source terminal coupled to the second drain source terminal of the right-hand p-type field effect transistor; a gate, and a second drain source terminal coupled to the selective ground. The gates of the left-hand n-type field effect transistors are interconnected with a first input voltage terminal VIN1 and the gates of the right-hand n-type field effect transistors are interconnected with a second input voltage terminal VIN2. In such cases, the measuring includes sweeping voltage at the first input voltage terminal with voltage at the second input voltage terminal fixed, until the output voltage VOUT at the second drain source terminal of the right-hand p-type field effect transistor equals zero. Again, it will be appreciated that an average value is effectively measured, to isolate the effects of block mask shift and average out the effect of statistical variations such as RDF.

It is to be emphasized that an advantage of one or more embodiments is that a variety of techniques can be used to determine the differences in threshold voltages, because all three terminals of the pertinent devices are accessible (i.e., the three terminals of each pull-down in FIG. 10; the three terminals of each pass gate in FIG. 11; and the three terminals of each pull-up in FIG. 12).

In another aspect, a method includes obtaining an actual integrated circuit conforming to a proposed integrated circuit design. The actual integrated circuit has formed thereon on-chip monitoring circuitry (e.g., FIGS. 13 and/or 15) configured to determine threshold voltage difference between at least two actual transistors on the actual integrated circuit. Further steps include measuring the threshold voltage difference between the at least two actual transistors on the actual integrated circuit; and determining actual block mask overlay in the actual integrated circuit by correlating the measured threshold voltage difference to results of testing on the proposed integrated circuit design, as discussed above.

In still another aspect, an on-chip monitoring circuit for determining threshold voltage difference includes circuitry as shown in FIGS. 13 and/or 15, and/or one or more repeated circuit structures (e.g., columns) as shown in FIG. 10, 11, and or 12.

One or more techniques as described above are used in the fabrication and/or test of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from low-end applications to advanced computer products having a display, a keyboard or other input device, and a central processor.

Exemplary Design Structure Details

Figure 19:
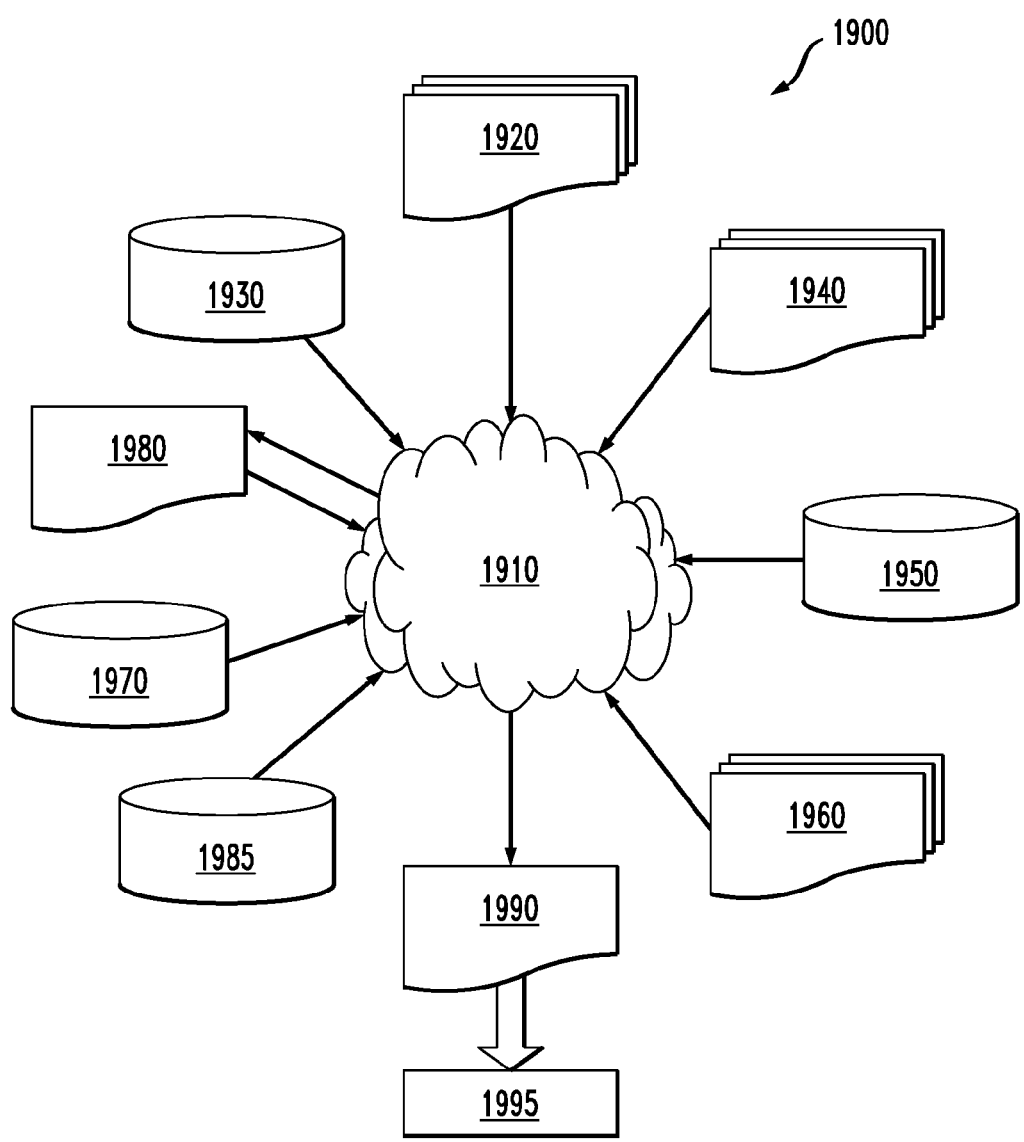
FIG. 19 is a flow diagram of a design process used in semiconductor design, manufacture, and/or test.

FIG. 19 shows a block diagram of an exemplary design flow 1900 used for example, in semiconductor IC logic design, simulation, test, layout, and manufacture. Design flow 1900 includes processes, machines and/or mechanisms for processing design structures or devices to generate logically or otherwise functionally equivalent representations of the design structures and/or devices described above and shown in FIGS. 2, 10-13, and 15. The design structures processed and/or generated by design flow 1900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 1900 may vary depending on the type of representation being designed. For example, a design flow

1900 for building an application specific IC (ASIC) may differ from a design flow 1900 for designing a standard component or from a design flow 1900 for instantiating the design into a programmable array, for example a programmable gate array (PGA) or a field programmable gate array (FPGA) offered by Altera® Inc. or Xilinx® Inc.

FIG. 19 illustrates multiple such design structures including an input design structure 1920 that is preferably processed by a design process 1910. Design structure 1920 may be a logical simulation design structure generated and processed by design process 1910 to produce a logically equivalent functional representation of a hardware device. Design structure 1920 may also or alternatively comprise data and/or program instructions that when processed by design process 1910, generate a functional representation of the physical structure of a hardware device. Whether representing functional and/or structural design features, design structure 1920 may be generated using electronic computer-aided design (ECAD) such as implemented by a core developer/designer. When encoded on a machine-readable data transmission, gate array, or storage medium, design structure 1920 may be accessed and processed by one or more hardware and/or software modules within design process 1910 to simulate or otherwise functionally represent an electronic component, circuit, electronic or logic module, apparatus, device, or system such as those shown in FIGS. 2, 10-13, and 15. As such, design structure 1920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 1910 preferably employs and incorporates hardware and/or software modules for synthesizing, translating, or otherwise processing a design/simulation functional equivalent of the components, circuits, devices, or logic structures shown in FIGS. 2, 10-13, and 15 to generate a Netlist 1980 which may contain design structures such as design structure 1920. Netlist 1980 may comprise, for example, compiled or otherwise processed data structures representing a list of wires, discrete components, logic gates, control circuits, I/O devices, models, etc. that describes the connections to other elements and circuits in an integrated circuit design. Netlist 1980 may be synthesized using an iterative process in which netlist 1980 is resynthesized one or more times depending on design specifications and parameters for the device. As with other design structure types described herein, netlist 1980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 1910 may include hardware and software modules for processing a variety of input data structure types including Netlist 1980. Such data structure types may reside, for example, within library elements 1930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 1940, characterization data 1950, verification data 1960, design rules 1970, and test data files 1985 which may include input test patterns, output test results, and other testing information. Design process 1910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 1910 without deviating from the scope and spirit of the invention. Design process 1910 may also include modules for performing standard circuit design processes such as timing analysis, verification, design rule checking, place and route operations, etc.

Design process 1910 employs and incorporates logic and physical design tools such as HDL compilers and simulation model build tools to process design structure 1920 together with some or all of the depicted supporting data structures along with any additional mechanical design or data (if applicable), to generate a second design structure 1990. Design structure 1990 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 1920, design structure 1990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 2, 10-13, and 15. In one embodiment, design structure 1990 may comprise a compiled, executable HDL simulation model that functionally simulates the devices shown in FIGS. 2, 10-13, and 15.

Design structure 1990 may also employ a data format used for the exchange of layout data of integrated circuits and/or symbolic data format (e.g. information stored in a GDSII (GDS2), GL1, OASIS, map files, or any other suitable format for storing such design data structures). Design structure 1990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 2, 10-13, and 15. Design structure 1990 may then proceed to a stage 1995 where, for example, design structure 1990: proceeds to tape-out, is released to manufacturing, is released to a mask house, is sent to another design house, is sent back to the customer, etc.

Exemplary System and Article of Manufacture Details

As will be appreciated by one skilled in the art, aspects of the present invention may be embodied as a system, method or computer program product (for example, control software for controlling fabrication tools or test setups, such as voltage supplies). Furthermore, aspects of the present invention may take the form of a computer program product embodied in one or more computer readable medium(s) having computer readable program code embodied thereon.

Portions of one or more embodiments of the invention can be implemented in the form of an apparatus (for example, a control system for controlling fabrication tools or test setups, such as voltage supplies) including a memory and at least one processor that is coupled to the memory and operative to perform or otherwise facilitate exemplary method steps.

Figure 18:
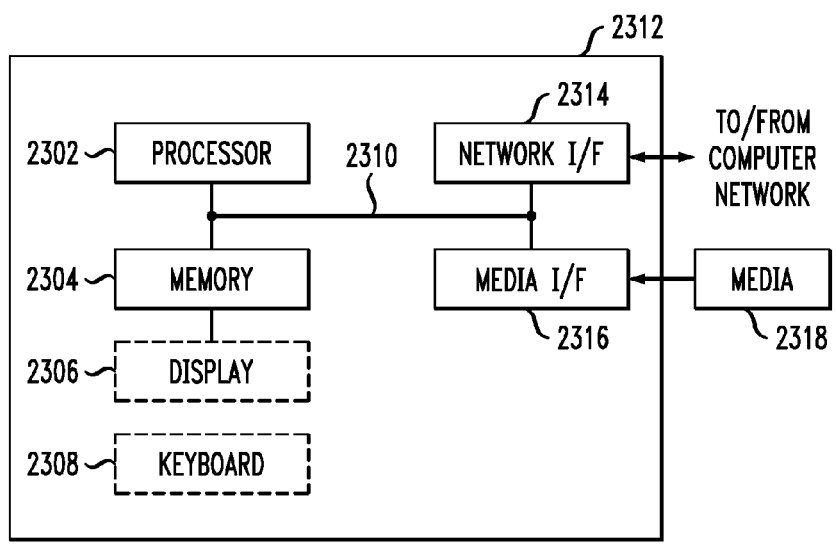
FIG. 18 depicts a computer system that may be useful in implementing one or more aspects and/or elements of the invention.

One or more embodiments can make use of software running on a general purpose computer or workstation. With reference to FIG. 18, such an implementation might employ, for example, a processor 2302, a memory 2304, and an input/output interface formed, for example, by a display 2306 and a keyboard 2308. The term "processor" as used herein is intended to include any processing device, such as, for example, one that includes a CPU (central processing unit) and/or other forms of processing circuitry. Further, the term "processor" may refer to more than one individual processor. The term "memory" is intended to include memory associated with a processor or CPU, such as, for example, RAM (random access memory), ROM (read only memory), a fixed memory device (for example, hard drive), a removable memory device (for example, diskette), a flash memory and the like. In addition, the phrase "input/output interface" as used herein, is intended to include, for example, one or more mechanisms for inputting data to the processing unit (for example, mouse), and one or more mechanisms for providing results associated with the processing unit (for example, printer). The processor 2302, memory 2304, and input/output interface such as display 2306 and keyboard 2308 can be interconnected, for example, via bus 2310 as part of a data processing unit 2312. Suitable interconnections, for example via bus 2310, can also be provided to a network interface 2314, such as a network card, which can be provided to interface with a computer network, and to a media interface 2316, such as a diskette or CD-ROM drive, which can be provided to interface with media 2318.

Accordingly, computer software including instructions or code for performing the methodologies of the invention, as described herein, may be stored in one or more of the associated memory devices (for example, ROM, fixed or removable memory) and, when ready to be utilized, loaded in part or in whole (for example, into RAM) and implemented by a CPU. Such software could include, but is not limited to, firmware, resident software, microcode, and the like.

A data processing system suitable for storing and/or executing program code will include at least one processor 2302 coupled directly or indirectly to memory elements 2304 through a system bus 2310. The memory elements can include local memory employed during actual implementation of the program code, bulk storage, and cache memories which provide temporary storage of at least some program code in order to reduce the number of times code must be retrieved from bulk storage during implementation.

Input/output or I/O devices (including but not limited to keyboards 2308, displays 2306, pointing devices, and the like) can be coupled to the system either directly (such as via bus 1010) or through intervening I/O controllers (omitted for clarity).

Network adapters such as network interface 2314 may also be coupled to the system to enable the data processing system to become coupled to other data processing systems or remote printers or storage devices through intervening private or public networks. Modems, cable modem and Ethernet cards are just a few of the currently available types of network adapters.

As used herein, including the claims, a "server" includes a physical data processing system (for example, system 2312 as shown in FIG. 18) running a server program. It will be understood that such a physical server may or may not include a display and keyboard.

As noted, aspects of the present invention may take the form of a computer program product embodied in one or more computer readable medium(s) having computer readable program code embodied thereon. Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. Media block 2318 is a non-limiting example. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It should be noted that any of the methods described herein can include an additional step of providing a system comprising distinct software modules embodied on a computer readable storage medium. The method steps can then be carried out using the distinct software modules and/or sub-modules of the system, as described above, executing on one or more hardware processors 2302. Further, a computer program product can include a computer-readable storage medium with code adapted to be implemented to carry out one or more method steps described herein, including the provision of the system with the distinct software modules.

In any case, it should be understood that the components illustrated herein may be implemented in various forms of hardware, software, or combinations thereof; for example, application specific integrated circuit(s) (ASICS), functional circuitry, one or more appropriately programmed general purpose digital computers with associated memory, and the like. Given the teachings of the invention provided herein, one of ordinary skill in the related art will be able to contemplate other implementations of the components of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method of characterizing block mask overlay tolerance of a static random access memory design, said method comprising the steps of:

fabricating a physical test integrated circuit having a plurality of repeating circuit portions comprising test static random access memory cells and corresponding to said static random access memory design, a first of said portions being fabricated with a nominal block mask location, additional ones of said portions being deliberately fabricated with predetermined progressive increased offset of said block mask location from said nominal block mask location, each of said test static random access memory cells in turn comprising a modified standard six field effect transistor static random access memory cell having a left-hand pass gate field effect transistor, a right-hand pass gate field effect transistor, a left-hand pull-up field effect transistor, a right-hand pull-up field effect transistor, a left-hand pull-down field effect transistor, and a right-hand pull-down field effect transistor, each of said test static random access memory cells being modified in that:

said left-hand pass gate field effect transistor and said right-hand pass gate field effect transistor are shorted;

said left-hand pull-up field effect transistor and said right-hand pull-up field effect transistor are shorted; and an input voltage node is provided by electrically connecting gates of said left-hand pull-up field effect transistor, said right-hand pull-up field effect transistor, said left-hand pull-down field effect transistor, and said right-hand pull-down field effect transistor;

for each of said portions, determining a difference in threshold voltage between one of said left-hand pull-down field effect transistor and said right-hand pull-down field effect transistor and another one of said left-hand pull-down field effect transistor and said right-hand pull-down field effect transistor, wherein said predetermined progressive increased offset of said block mask location is in a direction from said one of said left-hand pull-down field effect transistor and said right-hand pull-down field effect transistor to said another one of said left-hand pull-down field effect transistor and said right-hand pull-down field effect transistor;

determining said block mask overlay tolerance at a value of said progressive increased offset corresponding to an inflection of said difference in threshold voltage from a zero difference, and wherein, in said step of determining said difference in threshold voltage between said one of said left-hand pull-down field effect transistor and said right-hand pull-down field effect transistor and said another one of said left-hand pull-down field effect transistor and said right-hand pull-down field effect transistor, said direction from said one of said left-hand pull-down field effect transistor and said right-hand pull-down field effect transistor to said another one of said left-hand pull-down field effect transistor and said right-hand pull-down field effect transistor is parallel to an x-axis.

2. The method of claim 1, wherein said fabricating comprises fabricating said plurality of repeating circuit portions in a column with a plurality of rows, said first of said portions being fabricated in a first of said rows, said additional ones of said portions being fabricated in additional ones of said rows, said predetermined progressive increased offset of said block mask location from said nominal block mask location comprising a uniform increase for each successive one of said rows.

\* \* \* \* \*